United States Patent [19]

Cohen et al.

[11] 4,247,619
[45] Jan. 27, 1981

[54] NEGATIVE-WORKING MULTILAYER PHOTOSENSITIVE TONABLE ELEMENT

[75] Inventors: Abraham B. Cohen, Springfield; Roxy N. Fan, East Brunswick, both of N.J.

[73] Assignee: E. I. Du Pont de Nemours and Company, Wilmington, Del.

[21] Appl. No.: 105,648

[22] Filed: Dec. 20, 1979

Related U.S. Application Data

[63] Continuation-in-part of Ser. No. 747,025, Dec. 2, 1976, abandoned, which is a continuation-in-part of Ser. No. 583,456, Jun. 3, 1975, abandoned.

[51] Int. Cl.³ .............................................. G03C 11/12
[52] U.S. Cl. ...................................... 430/253; 430/271; 430/273; 430/286; 430/291; 430/302; 430/320
[58] Field of Search ............... 96/19, 15, 16, 28, 35.1, 96/67, 86 P, 87 R, 115 R, 115 P; 430/253, 271, 273, 286, 291, 302, 320

[56] References Cited

U.S. PATENT DOCUMENTS

| | | |
|---|---|---|
| 3,607,264 | 9/1971 | Celeste et al. ............................ 96/28 |
| 3,620,726 | 11/1971 | Chu et al. ................................. 96/28 |
| 3,754,920 | 8/1973 | Kuchta .................................. 96/87 R |
| 3,785,817 | 1/1974 | Kuchta ................................... 96/28 |
| 3,891,441 | 6/1974 | Tsuji et al. ............................. 96/35.1 |

*Primary Examiner*—Jack P. Brammer

[57] ABSTRACT

An improved peel apart photosensitive element comprises a strippable cover sheet, a photoadherent layer, and a tacky, nonphotosensitive contiguous layer receptive to colorant or particulate material, and a support. The element is useful in applications such as color proofing. Such elements are capable of producing reverse toned or colored images as well as duplicate colored images with greatly improved tonal range and image fidelity.

32 Claims, 2 Drawing Figures

NEGATIVE-WORKING MULTILAYER PHOTOSENSITIVE TONABLE ELEMENT

CROSS REFERENCE TO PRIOR APPLICATION

This is a continuation-in-part of application Ser. No. 747,025, filed Dec. 2, 1976 now abandoned which is a continuation-in-part of application Ser. No. 583,456, filed June 3, 1975, now abandoned.

BACKGROUND OF THE INVENTION

1. Field of the Invention

The invention relates to the field of image reproduction with photosensitive elements, particularly those comprising polymeric layers, which are peeled apart in the process of forming reverse images. Such elements are particularly useful for image reproduction for color proofing and related photomechanical uses, e.g., as lithographic transparencies, photomasks, photoresists, etc.

2. Description of the Prior Art

The prior art, e.g., Burg et al., U.S. Pat. No. 3,060,024 and U.S. Pat. No. 3,060,025; Celeste et al., U.S. Pat. No. 3,607,264; and Phlipot, U.S. Pat. No. 3,236,647, describes photopolymer elements and processes of use. Uncolored, photopolymerizable layers are selectively colored by applying colorants to imagewise exposed, clear photopolymerizable layers, so that the pigment adheres selectively to the unexposed areas. Chu and Cohen, U.S. Pat. No. 3,649,268 describes a process in which an element having a removable support and a photohardenable layer is (1) laminated to a receptor layer, and (2) imagewise exposed through the support to actinic radiation which selectively raises the stick temperature of those areas receiving the radiation, then (3) the support is stripped from the layers, and (4) the outer surface of the layer is treated (e.g., dusted) with a material, usually a colored pigment which adheres only to the unexposed areas of the layer thereby producing a positive image. By repeating the laminating, exposing with color separation records, stripping and treating steps in sequence, a multicolor image can be obtained. However, the process has the limitation of producing only a positive-working or duplicate image (i.e., the pigment image is a duplicate of the image on the transparency used for exposure) and is therefore restricted in use, particularly where it is desired to produce a negative-working or reverse image (i.e., an image which is complementary to the image on the transparency used for exposure).

Since the elements of the prior art generally produce toned images by adherence of toner to unexposed areas of a photopolymerizable layer, they produce duplicate images. An element is needed which will produce reverse toned images by a dry process for color proofs and photomasks, and in other areas where photopolymer systems are useful, e.g., color design work using custom colors. The elements of the prior art are also limited in the materials that can be used to provide a proper adhesion relationship, and peel apart elements of the prior art may have pinholes in the image due to improper adhesion. Adhesive values of prior art peel apart elements are typically below 20 g/inch with differences between exposed and unexposed areas being a fraction of this value. Such peel apart elements are characterized in the publication "Image Formation by Photoadhesion" by Woodruff et al., Photographic Science and Engineering, Vol. 11, No. 2, pp. 93–97, March–April 1967. Because of their limited tonal range and image fidelity such peel apart systems are restricted to less demanding uses, e.g., engineering drawings etc.

SUMMARY OF THE INVENTION

In accordance with this invention improved peel apart photosensitive elements are provided which comprise in order from top to bottom, (1) a strippable cover sheet comprised of a polymeric film which is transparent to actinic radiation, (2) a photoadherent layer comprising a photohardenable material with ethylenically unsaturated or benzophenone type groups, (3) a tacky, nonphotosensitive organic contiguous layer which is tonable by embedding of particulate material, and (4) a sheet support, the exposed areas (5) of said photoadherent layer, after imagewise exposure of said element to actinic radiation, having greater adhesion to said cover sheet than to said contiguous layer, and are removable with said cover sheet, and the unexposed areas (6) of said photoadherent layer having greater adhesion to said contiguous layer than to said cover sheet and are not removable with said cover sheet, said photoadherent layer being nontonable under a condition under which the contiguous layer is tonable.

DESCRIPTION OF THE PREFERRED EMBODIMENTS

The invention is a versatile photosensitive element capable of producing a variety of images, most preferably reverse images by a dry process. By "dry process" is meant a process in which liquids need not be used. The photoadherent layer, which is the sole photosensitive layer of the element, is one whose adhesive relationship between the cover sheet and the contiguous layer is altered by exposure to actinic radiation, so that after exposure the exposed areas of the photoadherent layer adhere more strongly to the cover sheet than to the contiguous layer and are removed with the cover sheet while the unexposed areas of the photoadherent layer adhere more strongly to the tacky contiguous layer than to the cover sheet.

Figure 1:
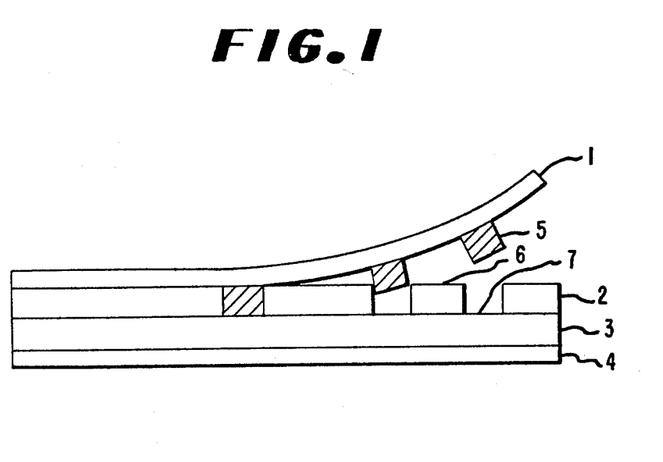
FIG. 1 of the drawings shows an element comprising a strippable cover sheet (1), a photoadherent layer (2), a contiguous layer (3), and a support (4). The exposed areas (5) of the photoadherent layer adhere to and are removed with the strippable cover sheet after imagewise exposure of the element to actinic radiation leaving unexposed areas (6) of the photoadherent layer remaining on the contiguous layer. The areas (7) of the contiguous layer, which are between the nontonable unexposed remaining areas (6) of the unexposed photoadherent layer, are then toned. The toning comprises embedding pigment particles into areas (7), producing a reverse toned image.
Figure 2:
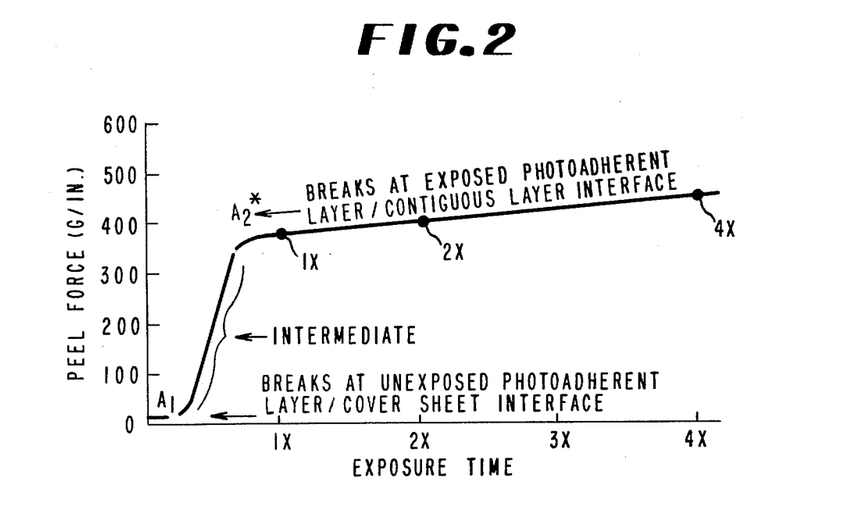
FIG. 2 of the drawings demonstrates the effect of exposure to actinic radiation of an element of the invention on the peel force required to remove or peel the cover sheet (1) from the element. In the initial exposure region where the amount of actinic radiation absorbed is insufficient to cause photoadhesion of the photoadherent layer (2) to the cover sheet (1), the peel force required to remove the cover sheet from the surface of the underexposed photoadherent layer is equivalent to the adhesive force $A_1$ between the photoadherent layer (2) and the cover sheet (1). As actinic exposure increases through an intermediate exposure region photoadhesion increases until in the exposure region where photoadhesion to the cover sheet (1) predominates, the locus of adhesive failure shifts to the interface between the surface (7) of the tacky contiguous layer and the exposed (5) photoadherent layer. Above the point where the locus of adhesive failure shifts, the peel force does not rise markedly with further exposure and the element is considered fully exposed. The dramatically higher peel force required to remove the cover sheet with the exposed photoadhered layer (5) from the surface (7) of the tacky contiguous layer (3) is equivalent to the adhesive force $A_2^*$ between the exposed layer (5) and the contiguous layer (3).

Adhesive and cohesive force relationships of the layers are useful in characterizing the elements of this invention wherein $A_1$ represents the adhesive force between the cover sheet (1) and the unexposed photoadherent layer (2); $A_2$ represents the adhesive force between the unexposed photoadherent layer (2) and the tacky contiguous layer (3); and C represents the cohesive value of the unexposed photoadherent layer (2). Thus in the unexposed state $A_1$ is the lowest value, and the element will peel at the cover sheet/photoadherent layer interface. The force relationship may be represented by:

$$C > A_1 < < A_2$$

It has been found that upon imagewise exposure of the element, dramatic changes occur in adhesive and cohesive values. $A_1^*$ represents the adhesive force between exposed areas (5) of the photoadherent layer (2) and the cover sheet (1); $A_2^*$ represents the adhesive force between exposed areas (5) and the tacky contiguous layer (3); and $C^*$ represents the cohesive value of the photoadherent layer in the exposed areas (5). Thus in the exposed state $A_2^*$ is the lowest value while the cohesive value C of the unexposed areas also must be sufficiently low to allow a clean break in the photoadherent layer (2) at the interface between the exposed areas (5) and unexposed areas (6) to allow exposed areas (5) to be completely removed when the cover sheet is peeled away. The resulting force relationship may be represented by:

$$C < A_1^* > > A_2^* < C^*$$

The combined effect of these cohesive and adhesive values is measured by the force required to peel or remove the cover sheet at an angle of 180° from the surface of an element as a function of the amount of actinic exposure and the cover sheet removal rate. Although peel force increases with increasing cover sheet removal rate, this increase is relatively small in the range of about 600 inches/minute (524 cm/minute). Typically for elements of this invention peel force in the exposed areas, $A_2^*$, is dramatically higher than in the unexposed areas, $A_1$, i.e., at least four times higher and preferably at least an order of magnitude difference. Surprisingly, these novel elements also show greatly improved image fidelity and tonal range. Thus in the unexposed state, the peel force to remove the cover sheet is very low and separation occurs at the interface between the cover sheet and the photoadherent layer and is equivalent to adhesive force $A_1$. For this invention adhesive forces $A_1$, typically are below 20 g/inch and are generally between 5 and 10 g/inch. Upon exposure, following the induction period, photopolymerization or photoadhesion starts and peel force values increase rapidly with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the tacky tonable layer. The peel force at this point reaches a plateau and remains substantially constant over an extensive exposure range. Peel forces in the plateau regions are equivalent to adhesive forces $A_2^*$. For this invention adhesive forces $A_2^*$ are typically above 80 g/inch, and preferably are between 100 and 700 g/inch. Thus the ratio of adhesive forces for exposure to unexposed elements, i.e., $(A_2^*/A_1)$ is at least 4, and preferably between 10 and 100 or above. By comparison, peel forces reported from previous peel apart systems such as disclosed in the above-mentioned Woodruff et al. article, U.S. Pat. Nos. 3,353,955, 3,607,264 and 3,754,920 are typically below about 20 g/inch (~7.9 g/cm) with ratios of peel forces between exposed and unexposed layers being about 2 or less.

The unexposed areas of the photoadherent layer remaining on the contiguous layer after stripping off the cover sheet must be nontonable under a condition under which the contiguous layer is tonable so that the toner is accepted only by the tacky contiguous layer. This condition may simply be room temperature with other normal ambient conditions; however, it is possible to select materials for the photoadherent layer and contiguous layer which differ in tonability only at an elevated temperature, or after heating and cooling, or in the presence of or after treatment with some reagent, etc. It is only required that under some condition the unexposed areas of the photoadherent layer remaining on the contiguous layer be nontonable while the contiguous layer is tonable. By "toning" is meant the embedding of material which modifies the surface that is toned. Most preferably, toning is the embedding of colorant or other particulate material. Thus the nontonable photoadherent layer is, or can be rendered, substantially more resistant to embedding by particulate material than the tacky contiguous layer into which particulate material can be embedded. The material, referred to as "toner", may be a colorant such as pigment particles or dye containing material, radiation absorbing material, particulate detackifying material, etc. While it is most preferred to use a dry particulate material as the toner so that image formation is a dry process, dye solutions and other liquids may be used in toning. The exposure and stripping of the cover sheet whereby an imagewise tonable element is formed is always a dry process according to the invention, however, the nontonable property of the remaining areas of the photoadherent layer and the tonable property of the contiguous layer may be due to their respective degrees of tackiness or softness which determine whether particulate material will adhere thereto and be embedded therein when applied, or they may be due to their respective degrees of absorptivity, hydrophilicity of reactivity with respect to the toner. In the most preferred embodiment, the contiguous layer contains more tacky material than the photoadherent layer and will therefore retain particulate material applied at room temperature while the remaining areas of the photoadherent layer will not.

The strippable cover sheet of the element of the invention must be strippable (i.e., removable by peeling it apart) from the rest of the element, carrying with it only the exposed areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and the polarity increased by a surface treatment such as electrostatic discharge or flame treatment. In the case of a polyethylene terephthalate film having a thickness of 0.0005 inch, an electrostatic discharge of at least 0.025 coulombs/ft$^2$ and preferably about 0.07 coulombs/ft$^2$ is suitable. However, increased treatments may be used. Flame treatment of the film also will provide good photoadhesion. An air-propane flame may be used.

While the thickness of the cover sheet may be varied over a wide range, films having a thickness of 0.001 inch or less are particularly preferred. Thin cover sheets produce halftone dots of good roundness with sharp edges. In addition, a tonable range of 2–98% dot resolution (using a halftone screen with 150 lines/inch) and a rapid rate of cover sheet strippability, e.g., up to 9,000 inches/minute (22,860 cm/minute) or higher, is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing. The cover sheet may additionally comprise auxiliary treatments or layers to improve adhesion, strength, and other properties.

After imagewise exposure of the peel apart photosensitive element to actinic radiation, the exposed areas of the photoadherent layer adhere more strongly to the cover sheet than to the contiguous layer in the exposed areas and more strongly to the contiguous layer than to the cover sheet in the unexposed areas. Photohardenable materials are used for the photoadherent layer. Such materials are usually comprised of a material with ethylenically unsaturated or benzophenone-type groups in which an increase in molecular weight and, consequently, an increase in adherence to the cover sheet are caused by exposure to actinic radiation. The well-known photohardenable materials which are comprised of an ethylenically unsaturated material which is photopolymerizable, photocrosslinkable, photodimerizable or combinations thereof are preferred. Such materials are described, for example, in Chu et al., U.S. Pat. No. 3,649,268. Particularly preferred are photopolymerizable compositions comprised of a macromolecular organic polymer binder and an addition polymerizable ethylenically unsaturated monomer. The binder can be a polar material such as an acidic polymer containing at least 1.5 mole percent free acid groups to impart polarity to the polymer, or a nonpolar material, e.g., materials as described in U.S. Pat. Nos. 3,649,268, 3,984,244 and 3,060,023. The monomer has at least one and preferably two or more terminal ethylenically unsaturated groups capable of free-radical initiated, chain propagated addition polymerization, said monomer preferably having some degree of polarity and being compatible with the binder and with the polar surface of the cover sheet, but substantially nondiffusible in the contiguous tonable layer. The photopolymerizable composition will also contain a free-radical generating addition polymerization photoinitiating system (i.e., at least one organic photoinitiator compound) activatable by actinic radiation, e.g., ultraviolet and visible radiation. Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers known in the art will be found useful as a binder in the photopolymerizable layer. Among the ethylenically unsaturated monomers which have been found useful are those disclosed in Plambeck, U.S. Pat. No. 2,760,863; Cohen and Schoenthaler, U.S. Pat. No. 3,380,831 and Chambers and Woodward U.S. Pat. No. 3,573,918. There may be mentioned as examples dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate $\beta$-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. Also useful are epoxy monomers containing ethylene unsaturation, e.g, monomers of the type disclosed in U.S. Pat. No. 3,661,576 and British Pat. No. 1,006,587. The binder may be varied widely in its ratio with the monomer but in general it should be in the range of 3:1 to 1:3. The monomer should be compatible with, and may be a solvent for, and/or have a plasticizing action on the binder. The choice and porportions of monomer and binder are made in accordance with the requirements of selective photoadherence and nontonability. In order to provide a nontonable composition, the monomer concentration is normally kept low so that the layer coated from the composition will be sufficiently hard and nontacky thereby not retaining toner particles during toning of the element. Usually, the photoadherent layer will be clear, but for some applications a colored layer may be desired.

The free-radical generating addition polymerization initiating systems activatable by actinic radiation may be, for example, any of those disclosed in Notley, U.S. Pat. No. 2,951,752; Chang and Fan, U.S. Pat. No. 3,549,367; Fan, U.S. Pat. No. 3,558,322; and Chang, U.S. Pat. No. 3,926,643. Other particularly useful initiating systems are disclosed in Cescon et al., U.S. Pat. No. 3,615,454; Grubb, U.S. Pat. No. 3,647,467; Baum et al., U.S. Pat. No. 3,652,275; Chang, U.S. Pat. No. 3,661,558; and Strilko, U.S. Pat. No. 3,697,280. The photopolymerizable layer may also contain other ingredients including plasticizers, antihalation agents and optical brightening agents. By the incorporation of optical brightening agents in the photoadherent layer, the image record is produced free from distortion due to halation effects and free from discoloration due to element components. Suitable optical brighteners can be found in Keller, U.S. Pat. No. 2,784,183 and Gurney, U.S. Pat. No. 3,644,394. Specific compounds which are particularly useful in the photopolymerizable layers of this invention are 2-(stilbyl-4'')-(naphtho-1',2',4,5)-1,2,3-triazol-2''-sulfonic acid phenyl ester hereinafter designated as Brightener I and 7-(4'-chloro-6'-diethyl amino-1',-3,5'-triazine-4'-yl) amino-3-phenyl-coumarin hereinafter designated as Brightener II. These compounds are useful in preparing sharp, bright, multicolor images with clean white backgrounds on toning with colorants as shown in U.S. Pat. No. 3,854,950.

While the coating weight of the photoadherent composition may be varied, it has been found that a preferred range from 20-100 mg/dm$^2$ (providing a dry layer thickness of about 0.00006-0.00033 inch) will give good image quality and tonable range.

The contiguous layer may be chosen from a great number of materials that will accept toner when bared by removal of areas of the photoadherent layer after imagewise exposure of the element to radiation that is actinic to the photoadherent layer. The contiguous layer is a nonphotosensitive tacky or slightly soft deformable organic material in which a particulate toner is embedded and adhered. The contiguous layer may be colorless or colored as desired. For an element with good aging stability, suitable materials for the contiguous layer should restrain monomer diffusion from the photoadherent layer into the contiguous layer. Such materials may be selected from resins, polymers in which monomer of the photoadherent layer is substantially nondiffusible, adhesive compositions, etc. Particularly preferred materials are elastomeric polymers and mixtures thereof having a second order transition temperature of $-10°$ C. or lower which are inherently tacky or will accept tackifying agents and which are nonmigratory into said photoadherent layer and which will impart tackiness to the layer. Rubber type polymers, both natural and synthetic may be used, e.g., isobutylene, Thiokol A, nitrile rubbers, butyl rubber, chlorinated rubbers, polymers of butadiene, isoprene, poly(vinylisobutylether), and random, teleblock and block copolymers of butadiene or isoprene copolymerized with styrene, and neoprene, silicone elastomers, etc., in various proprotions. With these materials, a stable adhesion balance between the photoadherent layer and a support for the contiguous layer, in a preferred element, may be achieved for elements useful in making color proofs by the overlay method or by the surprint method. These elastomeric materials are also preferred for their good tonability, i.e., ready acceptance and permanent retention of toners, e.g., pigment type colorants, and wide toning temperature latitude. The color density can also be further improved by the addition of tackifiers such as those described in Skeist, *Handbook of Adhesives*, Ch. 4, Reinhold Publishing Corp., 1962. Such tackifiers may comprise a polyterpene resin, a coumarone-indene resin, stabilized glycerol esters of abietic acid resin, stabilized acid wood rosin, a β-pinene polymer, and a cycloaliphatic resin. Particularly useful are the highly stabilized glycerol ester of abietic acid resin and low molecular weight cycloaliphatic hydrocarbon resins, both types having a softening point of about 85° C. The tackifier apparently associates with the rubber network of the elastomer and expands the volume fraction of the rubber phase, which tends to reduce stiffness and provides aggressive tackiness. Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch) will be satisfactory. The contiguous layer may also be coated as a dispersion, e.g., an aqueous dispersion with satisfactory results.

As illustrated in the drawings, the element has a support (4) for the contiguous layer (3). The support (4) may be any suitable film which has the necessary characteristics for the proper adhesion to layer (3) depending upon how the element is to be used, i.e., for surprint color proofing or overlay color proofing or for making photomasks, litho negatives, etc., for photomechanical processes. For color proofing by the overlay method, photographic grade polyethylene terephthalate films which may or may not contain an anchoring layer such as those disclosed in Alles, U.S. Pat. No. 2,779,684 may be used in the overlay method. Similar films which may or may not have a releasable coating, e.g., a silicone coating, may be used for the surprint method of color proofing. A thermoplastic layer may also be used which allows support (4) to be easily stripped from layer (3) yet holds layers (3) and (4) together when heat laminated or delaminated.

In the case where a thermoplastic coating is used, the stripping operation leaves the thermoplastic layer attached to the contiguous layer (3). A release film that does not require any special treatment is obviously the most convenient.

The manufacture of the above-described elements may be accomplished in several different ways. For example, the photoadherent layer (2) may be coated on the cover sheet (1) and then after drying, contiguous layer (3) is coated from a solvent solution and then after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat contiguous layer (3) onto a support (4) and then after drying the coated layers, laminating the surfaces of layers (2) and (3) under pressure at room temperature or elevated temperature. Layers (2) and (3) may also be coated simultaneously in order on support (1) and then a support (4) may be laminated to the outer surface of layer (3). All of these methods are known to those skilled in the art of coating multilayer films.

In using the novel film elements of this invention for making a color proofing image of the overlay type, the film elements are exposed to conventional halftone color separation negatives by means of actinic radiation to which the photoadherent layer is most sensitive, e.g., a carbon arc which is rich in ultraviolet radiation. Other radiation sources which may be used include mercury vapor or pulsed xenon lamps and lasers. The exposed elements are then delaminated at room temperature by stripping with a moderate to rapid continuous motion the cover sheet (1) from the element at an angle of generally at least 135° leaving a hardened positive image on the cover sheet and an image of uncovered contiguous layer on the element. The unexposed and nontonable image areas of photoadherent layer (2) remain on contiguous layer (3). The tonable image is toned with a suitable colorant, i.e., yellow, magenta, and cyan toning colorants, to give a color record. The process is repeated to produce separate color records which can be assembled in register in any desired order to give a three-color proof, each color record being a unitary element by itself. A black toned key image may be and usually is included. The toner is preferably a particulate coloring material, i.e., a dry powder. Suitable toners are disclosed in Chu and Manger, U.S. Pat. No. 3,620,726 and Gray U.S. Pat. No. 3,909,282. In the case of the overlay method of color proofing, the adhesion of layer (3) to support (4) must be greater than the adhesive forces between layer (3) and the exposed areas of layer (2).

In the surprint method of color proofing, the adhesion between layer (3) and support (4) must be less than the adhesive forces between layers (2) and (3) and (2) and (1). In the surprint method, support (4) is stripped from the surface of contiguous layer (3), and the surface of layer (3) is adhered to an opaque surface preferably under heat and pressure. Suitable opaque materials may be paper, plastic films, or metal supports, which have been especially treated to have a higher adhesion for layer (3) than the adhesive forces between layers (2) and (3) and cover sheet (1) and layer (2). The element is then exposed through a color separation negative, e.g., a minus-blue or yellow record, and through the cover sheet (1), and cover sheet (1) is then stripped off rapidly at an angle of at least 135° to give a hardened image adhered to cover sheet (1) and bared areas of the contiguous layer (3) corresponding to the hardened image. The resulting tacky image area is toned with the desired toner, e.g., yellow, and the the process is repeated by laminating the surface of layer (3) of a second element and again carrying out in registration the exposing, stripping and toning operations to give a second toned record, e.g., the magenta image. A third toned record, e.g., cyan, and a black key record may also be added in the same manner.

The invention provides a particularly preferred element using materials as described which has improved properties particularly suitable for the processes of the invention. The element with the preferred combination of materials comprises, in order, (1) a strippable cover sheet comprised of an electrostatic discharge or flame treated polymeric film which is transparent to actinic radiation, (2) a nontonable photohardenable layer which upon imagewise exposure to actinic radiation adheres to and is removable with said cover sheet only in the exposed areas, (3) a tacky nonphotosensitive contiguous layer which is tonable by embedding of particulate material, and (4) a sheet support.

The particulate material can be applied in any manner known in the art, e.g., by dusting, rubbing with a pad or brush, cascading, with air under pressure, etc. The particulate material must be embedded in the tacky contiguous layer, but there must be substantially no toning of the adjacent photoadherent layer. The preferred photohardenable material is photopolymerizable, and the preferred cover sheet is polyethylene terephthalate. The preferred contiguous layer material is a tacky elastomer.

These elements utilize the combination of a tonable tacky contiguous layer which provides good adhesion to the photoadherent layer and a very high photoadhesion of electrostatic discharge or flame treated film to exposed photopolymer which overcomes the adhesion of the tacky contiguous layer only in the exposed areas. The tonable tacky contiguous layer also provides good adhesion to previous toned or untoned elements as in the surprint mode. The tacky contiguous layer may be chosen to provide the proper balance of adhesive properties for the element and furthermore is extremely well suited to toning with particulate material, providing good adherence of particles and wide temperature latitude.

The use of the above-described elements provides a number of additional advantages over the elements of the prior art. A negative-working process is provided whereas the prior art elements of the above patents are generally limited to positive-working methods in their use, that is, a positive transparency produces a positive image. An added advantage is that because both the nontonable photoadherent layer and the tonable contiguous layer can be clear, exposure to actinic radiation can be more efficient, and upon delamination and toning of the bared image areas of the contiguous layer, good, sharp images completely free of background stain are obtained. The integral contiguous layer of this invention eliminates the difficult handling operations in bringing a separate receptor in contact with tacky layers following exposure as is required in the prior art of thermal and pressure transfer processes. Since the contiguous layer is integral with the photoadherent layer during exposure, it also eliminates image distortions which could occur in establishing this contact after exposure. In addition, the contiguous layer and adherent cover sheet provide a sufficiently impermeable barrier to oxygen to prevent oxygen inhibition of the polymerization reaction in the photoadherent layer. The elements of the present invention provide a method of obtaining very uniform color densities. When developed, the elements of the invention produce a novel structure comprising a tonable layer bearing on its surface image areas of polymeric material and complementary toned image areas into which particulate material has been embedded.

EXAMPLES

The following examples illustrate the invention wherein the parts and percentages are by weight. In the examples where peel force values are given, the peel forces determined at a very slow peel rate, e.g., 20 inches/minute (50.8 cm/minute) are measured using standard "Instron" tensile testing instruments at cross head speed of 20 inches/minute (50.8 cm/minute) and at an angle of 180°, e.g., Model TTB. Peel forces determined at high peel rates, e.g., 600 inches/minute to 9000 inches/minute (1524 cm/minute to 22,860 cm/minute) or more, are measured as follows: a calibrated spring scale is attached by means of a clamp to one end of the support of a one-inch (2.54 cm) wide sample element. A film leader from a motor driven calibrated takeup roll is attached to the cover sheet of the sample element so as to remove the cover sheet at a peel angle of 180° from the surface of the element when the roll is activated. The peel force (g/inch) is measured directly on the spring scale.

In the examples where peel force values are given, the peel forces are determined with samples which have been uniformly and fully exposed to the actinic radiation designated without the use of any phototool. Peel forces of unexposed samples are below 20 g/inch and typically are between about 5 and 10 g/inch.

EXAMPLE 1

An overlay type negative-working proof was made in the following manner:

I. Nontonable Photoadherent Layer: Photopolymerizable Coating Composition

For the photoadherent layer a coating solution of a photopolymerizable composition was prepared by mixing together the following ingredients:

| | | |
|---|---:|---|
| Poly(methyl methacrylate/methacrylic acid) (90/10) (M.W. 30,000–50,000) | 150.0 | g |
| Dipentaerythritol acrylate (50% tetra, 50% penta) | 130.0 | g |
| (2-o-Chlorophenyl-4,5-diphenyl imidazolyl) dimer | 8.0 | g |
| Brightener I (described above) | 5.0 | g |
| Brightener II (described above) | 2.25 | g |
| 2,2'-Dihydroxy-4-methoxybenzophenone | 2.0 | g |
| 2-Mercaptobenzothiazole | 4.0 | g |
| Methylene chloride | 1781.0 | g |
| Methyl alcohol | 155.0 | g |

Four samples of a polyethylene terephthalate film having a thickness of 0.005 inch which had been surface treated by electrostatic discharge at 0.05 coulombs/ft$^2$ were coated with the above solutions at a coating weight of about 35 mg/dm$^2$ when dried.

II. Contiguous Layer: Tacky Elastomer Coating Composition

A coating solution was prepared by mixing together the following ingredients:

| | | |
|---|---:|---|
| Styrene-butadiene block copolymer (30/70) (Brookfield Viscosity, 25% solution in toluene measured at 25° C. Brookfield Viscosimeter, Model LVF, Spindle No. 3 of 6 RPM, Min. 3000-Max 5000 cps.) | 600.0 | g |
| Highly stabilized glycerol ester resin of abietic acid (softening point 82° C. Acid Number 9) (Floral 85, Hercules) | 450.0 | g |
| Methylene chloride to make | 6380.0 | g |

The solution was coated on samples of polyethylene terephthalate film having a thickness of 0.0025 inch to give a coating weight of about 100 mg/dm$^2$ when dried.

III. Laminating Procedure

The coated photopolymerizable layer elements (I) and the tacky layer elements (II) were laminated in surface to surface relationship at room temperature with a pressure of 40 pounds per square inch.

IV. Exposure, Imaging and Toning Procedure

The laminated elements resulting from step III were exposed through halftone color separation negatives including a black printer negative by means of a carbon arc (B-1C Constantarc-140 amp. No. 1112-Ld612 MacBeth Arc Lamp Co., Philadelphia, PA) for 15 seconds at 56 inches from the lamp. Five minutes after exposure, the elements were delaminated by peeling the electrostatic discharge treated polyethylene terephthalate cover sheet at an angle of about 180° at a rate of about 720 inches per minute. The peel force of a test sample is about 580 g/inch. The resulting exposed areas of the photopolymerizable layer adhered to the electrostatic discharge treated cover sheet and were removed with said cover sheet as a positive polymer image thereon, i.e., a reverse image of the original separation negative. The complementary unexposed image areas remained on the contiguous layer and do not accept toner. Readouts of the respective color records for the multicolored final proof were obtained by coloring the elements with the appropriate colored toners in the manner disclosed in the above Chu and Manger Patent, U.S. Pat. No. 3,620,726, the resulting blue printer positive being toned with a yellow toner, the resulting green printer positive being toned with a magenta or reddish toner, the resulting red printer positive being toned blue, i.e., cyan, and the resulting black printer positive being toned with a carbon black pigment. The toner was applied by lightly rubbing the element with a fibrous pad containing the toner particles. The particles do not adhere to the areas bearing the nontonable unexposed photopolymerizable material but do become embedded into the areas of the tonable contiguous layer from which the exposed, nontonable photopolymerizable material had been removed, thereby producing a reverse toned image. The elements were then assembled in register to give an excellent quality reverse color proof of the overlay type. Tests show that the elements are capable of resolving 0.001 inch isolated lines and render a tonal range of 2–98% (150 line/inch screen). Unexposed elements showed good aging stability under oven conditions of 50° C.

EXAMPLE 2

A negative-working color proof of the surprint type was made in the following manner:

I. Nontonable Photoadherent Layer: Photopolymerizable Coating Composition

For the photoadherent layer a coating solution of a photopolymerizable composition was prepared by mixing together the following ingredients:

| | | |
|---|---:|---|
| Poly(methyl methacrylate/methacrylic acid) (90/10) (M.W. 30,000–50,000) | 75.0 | g |
| Polyethylene glycol dimethacrylate | 57.5 | g |
| (2-o-Chlorophenyl-4,5-diphenyl imidazolyl) dimer | 6.0 | g |
| Brightener I (described above) | 0.79 | g |
| Brightener II (described above) | 3.55 | g |
| 2,2'-Dihydroxy-4-methoxybenzophenone | 0.32 | g |
| 2-Mercaptobenzothiazole | 2.0 | g |
| Methyl alcohol | 77.5 | g |
| Methylene chloride | 870.0 | g |

Four pieces of polyethylene terephthalate film having a thickness of 0.0005 inch which had been surface treated by electrostatic discharge at 0.05 coulombs/ft$^2$ were coated with the above solution at a coating weight of about 35 mg/dm$^2$ when dried.

II. Contiguous Layer: Tacky Elastomer Coating Composition

A coating solution was prepared by mixing together the following ingredients:

| | | |
|---|---:|---|
| Stryene/butadiene block copolymer (25/75) (Typical Mooney Viscosity ML4 at 100° C. 47) | 15.0 | g |
| Methylene chloride to make | 100.0 | g | the solution was coated on samples of polyethylene terephthalate film having a releasable layer of polydimethyl siloxane coated thereon to give a coating weight of 100 mg/dm$^2$ when dried.

III. Laminating Procedure

The coated photopolymerizable layer elements (I) and the tacky layer elements (II) were laminated in surface to surface relationship at room temperature with a pressure of 40 pounds per square inch.

IV. Operations for Constructing a Surprint

The laminated elements resulting from step III were handled as follows:

The polyethylene terephthalate cover sheet with the release coating was stripped from the tonable tacky layer of an element which was then laminated at 100° C. to a paper support (identified as Kromkote ® marketed by the Champion Paper Corporation). The element was then exposed to a halftone negative, minus-blue, color separation film record through the electrostatic discharge treated clear film cover sheet in contact with the nontonable, photopolymerizable layer for 15 seconds on an exposing device identified as a nuArc ® Plate Maker "Flip-Top" manufactured by the nuArc Company, Chicago, IL. The element was held for 5 minutes, and the clear film cover sheet was stripped from the tacky layer at an angle of from 135°–180° at a rate of higher than 9000 inches per minute. The peel force of a test sample is 710 g/inch. The exposed, positive image photoadhered to the electrostatic discharge treated film thus exposing equivalent areas of the tacky elastomer contiguous layer. The bared areas of the contiguous layer were toned with a yellow toner as described in Example 1. A second photosensitive element was stripped off the release film and laminated to the surface of the yellow image and exposed to a halftone negative minus-green color separation film record in registration, the surface treated cover sheet was stripped from the contiguous layer leaving bared a positive image which was toned with a magenta (reddish) toner. The process was repeated for the minus-red and black negative records to give a high quality positive surprint color proof useful in the lithographic printing arts. A fifth layer is laminated and is exposed uniformly, and the cover sheet is left in place as a protective outer surface. The elements showed good stability under conditions of oven aging at 50° C. of over two weeks.

EXAMPLE 3

An overlay type of color proof was made in the following manner:

I. Nontonable Photoadherent Layer: Photopolymerizable Coating Composition

For the photoadherent layer a coating solution of a photopolymerizable composition was prepared by mixing together the following ingredients:

| | | |
|---|---|---|
| Poly(methyl methacrylate/methacrylic acid) (90/10) (M.W. 30,000–50,000) | 150.0 | g |
| Pentaerythritol triacrylate | 124.6 | g |
| (2-o-Chlorophenyl-4,5-diphenyl imidazolyl) dimer | 8.0 | g |
| Brightener I (described above) | 5.0 | g |
| Brightener II (described above) | 2.25 | g |
| 2,2'-Dihydroxy-4-methoxybenzophenone | 2.0 | g |
| 2-Mercaptobenzothiazole | 4.0 | g |
| Methylene chloride | 1781.0 | g |

Four samples of electrostatic discharge treated polyethylene terephthalate film were coated with the above solutions at a coating weight of 38 mg/dm$^2$ when dried.

II. Contiguous Layer: Tacky Elastomer Coating Composition

A coating composition was prepared by mixing the following ingredients:

| | |
|---|---|
| Styrene-butadiene block copolymer 30/70 of Example 1 | 600.0 g |
| Highly stabilized glycerol ester of abietic acid | 450.0 g |
| Methylene chloride to make | 6380.0 g |

The solution was coated on samples of polyethylene terephthalate film having a thickness of 0.0025 inch to give a coating weight of about 100 mg/dm$^2$ when dried.

III. Laminating Procedure

Carried out as in Example 1.

IV. Exposure, Imaging and Toning Procedure

Carried out as in Example 1 to give excellent quality overlay elements similar to those obtained in that Example. The cover sheet was peeled as described in Example 1 with similar results being obtained.

EXAMPLE 4

Example 3 was repeated except that the monomer, pentaerythritol triacrylate, in the photopolymerizable layer was replaced with 124.0 grams of polypropylene glycol (450) ether of pentaerythritol tetraacrylate. The resulting overlay color proof was of good quality. The structure was capable of resolving 0.001 inch isolated lines and rendering 5–95% tonal range (150 line/inch screen). The dot quality of the toned halftone images was excellent and the aging stability test in an oven at 50° C. showed no speed loss over a period of time greater than one week. Similar good quality color elements were obtained using polyethylene glycol dimethacrylate and trimethylolpropane triacrylate as the polymerizable monomeric compounds in the photopolymerizable layers. When the cover sheets of test samples of these elements were peeled at 20 inches/minute, the peel force is about 500 g/inch.

EXAMPLE 5

Surprint type color proofing elements were made in the following manner:

I. Nontonable Photoadherent Layer: Photopolymerizable Composition

A coating solution was prepared as in Example 2 and was coated on polyethylene terephthalate film having a thickness of 0.0005 inch which had been surface treated by electrostatic discharge at 0.07 coulomb/ft$^2$. The coating weight was about 43–47 mg/dm$^2$.

II. Contiguous Layer: Tacky Elastomer Coating Composition

A 15% solution of a block copolymer of styrene-/butadiene (25/75) of Example 2 in methylene chloride was coated on an untreated polypropylene film to give a coating weight of about 120 mg/dm$^2$.

III. Laminating Procedure

Samples of the photopolymerizable element were laminated in surface to surface contact with the tacky elastomer layers on the polypropylene at room temperature with a pressure of 40 pounds per square inch.

IV. Preparation of Surprint Color Proofs

Samples from step III were handled as described in Example 2, part IV, except that the polypropylene film was removed by stripping at an angle of 180° and after exposure, the holding time was two minutes. The peel force was about the same as that of Example 2. Good quality surprint proofs were obtained in all cases. Also polyfluoroethylene was used in place of the polypropylene and gave good release characteristics.

EXAMPLE 6

Example 2 was repeated except that the tonable tacky elastomer layer was coated on 0.001 inch thick polyethylene film. All other operations of construction and use were carried out as outlined in Example 2 to give similar results.

EXAMPLE 7

Example 2 was repeated except that the tonable layer was coated from a 12% methylene chloride solution of a random copolymer of styrene and butadiene (43/57) (Raw Typical Mooney Viscosity 46) onto a 0.001 inch thick polyethylene terephthalate film which had a polydimethyl siloxane release coating. The coating weight of the tacky tonable elastomer layer was 120 mg/dm$^2$. All other operations were carried out as described in Example 2 to give a good quality color proof. The peel force of test samples is 182 g/inch when peeled at 20 inches/minute.

EXAMPLE 8

Example 1 was repeated except that in part I in place of the binder, poly/methyl methacrylate/methacrylic acid 90/10, there was used a binder wherein the above ingredients were copolymerized in a ratio of 98.5/1.5 and in place of dipentaerythritol acrylate there was used pentaerythritol tetraacrylate in a ratio of binder to monomer of 1.3 to 1. All other coatings and procedures were carried out as in Example 1 to give a good quality overlay color proof.

EXAMPLE 9

Example 8 was repeated except that the binder in the photopolymerizable layer was composed of 86.5% methyl methacrylate and 13.5% methacrylic acid (relative viscosity of a 10% by weight solution on a calibrated Ubbeholde Viscometer (1B) at 25° C. was 4) and the monomer was polyethylene glycol (600) dimethacrylate and the ratio of binder to monomer was 1.7 to 1. A good quality overlay color proof was obtained.

EXAMPLE 10

An overlay type of color proof was made in the following manner:

I. Nontonable Photoadherent Layer: Photopolymerizable Coating Composition

A coating solution was prepared by mixing together the following ingredients:

| | |
|---|---|
| Poly(methyl methacrylate/methacrylic acid (90/10) of Example 1 | 15.0 g |
| Polyethylene glycol dimethacrylate | 7.5 g |
| (2-o-Chlorophenyl-4,5-diphenyl imidazolyl) dimer | 1.2 g |
| 2-mercaptobenzothiazole | 0.4 g |
| Methylene chloride | 260.0 g |
| Methyl alcohol | 16.4 g |

The resulting solution was coated on the electrostatic discharge treated polypropylene in place of the film of Example 1.

II. Contiguous Layer: Tacky Elastomer Coating Composition

This composition was the same as that in Example 2, except that the solution was coated on untreated polyethylene terephthalate film. Carrying out the rest of the operations as described in Example 1 the results showed that upon exposure, good photoadhesion occurred between the exposed areas of the photopolymerizable layer and the electrostatic discharge treated polypropylene film given good separation between the exposed photopolymer and the tacky tonable layer which allowed good color toning to give a high quality color image. The peel force was the same as that determined in Example 2.

EXAMPLE 11

Example 10 was repeated except that the photopolymerizable layer was coated on 0.001 inch thick polyethylene terephthalate film treated with a propane flame as described in Bryan, U.S. Pat. No. 3,145,242. As in Example 10, good photoadhesion between the film and exposed photopolymer was determined to give good tonable layer elements upon separation of the exposed element. The peel force was the same as that determined in Example 2.

EXAMPLE 12

Example 10 was repeated except that in the composition for the photopolymerizable layer there was added in addition to the ingredients present therein, 0.73 gram of 2,2'-dihydroxy-4-methoxybenzophenone. All other procedures were carried out as described in Example 2 to give a good quality surprint type color proof. The peel force was the same as that determined in Example 2.

EXAMPLE 13

Example 10 was repeated except that in the composition for the nontonable photopolymerizable layers there was added in addition to the ingredients therein, 15.0 grams of 4,4'-bisdimethylaminobenzophenone. All other procedures were carried out as described in Example 2 to give a good quality surprint type color proof. The peel force was the same as that determined in Example 2.

EXAMPLE 14

An overlay type color proof was made as follows:

I. Nontonable Photoadherent Layer: Photopolymerizable Coating Composition

A coating solution was prepared by mixing together the following ingredients:

| | | |
|---|---|---|
| Poly(methyl methacrylate/methacrylic acid) (90/10) of Example 1 | 75.0 | g |
| Pentaerythritol tetraacrylate | 57.5 | g |
| (2-o-Chlorophenyl-4,5-diphenyl imidazolyl) dimer | 4.0 | g |
| Brightener I (described above) | 2.5 | g |
| Brightener II (described above) | 1.12 | g |
| 2,2'-Dihydroxy-4-methoxy-benzophenone | 1.0 | g |
| 2-Mercaptobenzothiazole | 2.0 | g |
| Methyl alcohol | 77.5 | g |
| Methylene chloride | 890.5 | g |

The resulting composition was coated on a 0.0005 inch thick polyethylene terephthalate film electrostatic discharged treated at 0.07 coulombs/ft².

II. Contiguous Layer: Tacky Elastomer Coating Composition

A coating solution was prepared by mixing together the following ingredients:

| | | |
|---|---|---|
| Styrene/butadiene block copolymer (30/70) of Example 1 | 100.0 | g |
| Modified cycloaliphatic hydrocarbon resin (tackifier) (softening point R & B, 105° C., Permalyn® XAR, Hercules | 74.0 | g |
| Methylene chloride to make | 1160.0 | g |

The resulting solution was coated on 0.0025 inch thick polyethylene terephthalate film to give a calculated coating weight of 113 mg/dm².

III. Laminating Procedure

The surfaces of the photopolymerizable layer and the tacky tonable elastomer layer were laminated to each other at room temperature with a pressure of 40 pounds per square inch.

IV. Exposure, Imaging and Toning Procedure

These operations were carried out as described under part IV of Example 1 above to give a good quality overlay color proof. The peel force of a test sample is ~480 g/inch when peeled at 20 inches/minute.

EXAMPLE 15

Example 14 was repeated except as a tackfier in the tonable layer composition there was used a polyterpene resin (softening point R & B, 115° C., Terpalyn® XC11S, Hercules) in place of the modified cycloaliphatic resin of that example. All other compositions and operation were carried out as in Example 14 to give a good quality overlay type color proof.

EXAMPLE 16

Example 14 was repeated except as a tackifier in the tonable layer composition there was used an unmodified cycloaliphatic resin (softening point R & B, 85° C., Permalyn® XAB5, Hercules) in place of the modified cycloaliphatic resin of that Example. All other compositions and operations were carried out as in Example 14 to produce a good quality overlay type of color proof. The peel force of a test sample is 400 g/inch when peeled at 20 inches/minute.

EXAMPLE 17

A color proof of the surprint type was made in the following manner:

I. Nontonable Photoadherent Layer; Photopolymerizable Coating Composition

A coating solution was prepared and coated as disclosed in part I of Example 2.

II. Contiguous Layer: Tacky Elastomer Coating Composition

A coating composition was prepared by mixing the ingredients disclosed under part II of Example 14.

III. Thermal Adhesive Layer

A coating composition was prepared by mixing the following ingredients:

| | | |
|---|---|---|
| Polymethyl methacrylate | 75.0 | g |
| Polyethylene glycol dimethacrylate | 35.0 | g |
| Methylene chloride to make | 1000.0 | g |

The resulting solution was coated on a 0.001 inch thick, polypropylene film and dried to give a dry coating weight of 35 mg/dm². The layer composition from II above was coated over the surface of the coated layer III to give a coating weight of about 100 mg/dm².

IV. Laminating Procedure

The surface of the photopolymerizable layer of part I was laminated to the surface of the tonable layer of the element of part III at 30° C. and at a pressure of 40 pounds per square inch.

V. Operations for Constructing a Surprint

Structures as described above were transferred as desired in part IV of Example 2 after polypropylene supports of each element as constructed in part III were delaminated, and the surface of the thermal adhesive layer which remains on the tonable layer is laminated to the paper support at a temperature of 100° C. and a pressure of 40 pounds per square inch. All other operations were carried out as described under part IV of Example 2 to form a good quality surprint type color proof. The peel force of a test sample is 670 g/inch when peeled at 20 inches/minute.

EXAMPLE 18

An overlay color proof film was made in the following manner:

I. Nontonable Photoadherent Layer: Photopolymerizable Coating Composition

A coating solution was made by mixing the following ingredients:

| | | |
|---|---|---|
| Poly(methyl methacrylate/methacrylic acid) (90/10) of Example 1 | 75.0 | g |
| Polyethylene glycol dimethacrylate | 42.5 | g |
| (2-o-Chlorophenyl-4,5-diphenyl imidazolyl) dimer | 6.0 | g |
| Brightener I (described above) | 0.79 | g |
| Brightener II (described above) | 3.55 | g |
| 2,2'-Dihydroxy-4-methoxybenzophenone | 0.315 | g |
| 2-Mercaptobenzothiazole | 2.0 | g |
| Methyl alcohol | 77.5 | g |

| | |
|---|---|
| -continued | |
| Methylene chloride to make | 1000.0 g |

The resulting solution was coated on electrostatic discharge treated polyethylene terephthalate film as described in Example 2 to give a coating weight of 40 mg/dm².

II. Contiguous Layer: Elastomer Coating Composition

A coating solution was prepared by mixing the following ingredients:

| | |
|---|---|
| Block Copolymer of styrene/isoprene (15/85) (Brookfield viscosity, 25% solution in toluene measured at 25° C., 1200-2000 cps., Brookfield Viscosimeter, Model LVF, Spindle No. 3 at 6 RPM) | 12.0 g |
| Methylene chloride to make | 100.0 g |

The resulting solution was coated on 0.0025 inch thick polyethylene terephthalate film to give a coating weight of 84.0 mg/dm².

III. Laminating Procedure

Films for each color record (four) from parts I and II were laminated as described in Example 1.

IV. Operations for Constructing an Overlay Color Proof

Carried out as described in Example 1 to give a good quality overlay color proof. The peel force of a test sample is 560 g/inch when peeled at 20 inches/minute.

EXAMPLE 19

Example 18 was repeated using in place of the block copolymer of styrene/isoprene (15/85), a teleblock copolymer of styrene/butadiene (30/70) (inherent viscosity, THF 1.50). The resulting color proof was of high quality and comparable to that obtained in Example 1. The peel force of a test sample is 215 g/inch when peeled at 20 inches/minute.

EXAMPLE 20

A color proof of the surprint type was made in the following manner:

I. Nontonable Photoadherent Layer: Photopolymerizable Coating Composition

Prepared and coated as described in part I of Example 2 except the polyethylene terephthalate film was electrostatic discharge treated at 0.07 coulombs/ft².

II. Contiguous Layer: Tacky Elastomer Coating Composition

A coating composition was prepared by mixing together the following ingredients:

| | |
|---|---|
| Cis-polybutadiene (Raw Mooney Typical Viscosity 40) | 360.0 g |
| Random copolymer of styrene/butadiene (40/60) (Raw Mooney Typical Viscosity 34) | 240.0 g |
| Tetra bis[methylene 3-(3',5'-di-t-butyl-4'-hydroxyphenyl) propionate] methane | 3.0 g |

| | |
|---|---|
| -continued | |
| Methylene chloride | 5400.0 g |

The resulting solution was coated on samples of polyethylene terephthalate film having a releasable layer of polydimethyl siloxane coated thereon to give a coating weight of 100 mg/dm² when dried to give a layer of cis-polyisobutadiene and polystyrene copolymer in a ratio of 60/40.

III. Laminating Procedure

Carried out as described in Example 2, part III except that the laminating temperature was 50° C.

IV. Operations for Constructing a Surprint Color Proof

These operations were carried out as described in Example 2, part IV except that the tacky layers after removal of the polyethylene terephthalate films with the release layers, were laminated to the paper support at room temperature. A surprint was obtained which was comparable in quality and aging stability to that obtained in Example 2. The peel force of a test sample is 520 g/inch when peeled at 20 inches/minute.

EXAMPLE 21

Example 20 was repeated except that the cis-polybutadiene and polystyrene/butadiene polymer in the tacky elastomer of part II was compouded in the ratio of 70/30. A good quality surprint type color proof was obtained.

EXAMPLE 22

Example 20 was repeated except that the polystyrene copolymer was omitted from the tacky tonable layer coating composition and only the cis-polybutadiene was used in an amount to give a 9% methylene chloride solution. A good quality surprint was produced. The peel force of a test sample is 140 g/inch when peeled at 9000 inches/minute.

EXAMPLE 23

An element was made in the following manner:

I. Nontonable Photoadherent Layer: Photopolymerizable Coating Composition

| | |
|---|---|
| Poly(methyl methacrylate/methacrylic acid) (90/10) | 15.00 g |
| Pentaerythritol triacrylate β-hydroxy ethyl ether | 13.50 g |
| (2-o-Chorophenyl-4,5-diphenyl imidazolyl) dimer | 0.80 g |
| Brightener I (described above) | 0.45 g |
| Brightener II (described above) | 0.23 g |
| 2,2'-Dihydroxy-4-methoxybenzophenone | 0.20 g |
| 2-Mercaptobenzothiazole | 0.40 g |
| C.I.S. Red 109 | 0.36 g |
| Methylene chloride | 235.00 g |
| Methyl alcohol | 30.0 g |

The resulting composition was coated on the polyethylene terephthalate electrostatic discharge treated film described in Example 1 to give a coating weight of 40 mg/dm² when dried.

II. Contiguous Layer: Tacky Elastomer Coating Composition

A coating solution as prepared in part II, Example 1 was coated on a 0.0025 inch thick polyethylene terephthalate film at a coating weight of 120 mg/dm$^2$ when dried.

III. Laminating Procedure

The red colored photopolymerizable element and the clear tacky layer elements were laminated in surface to surface relationship at room temperature with a pressure of 40 pounds per square inch.

IV. Exposure, Imaging and Toning Procedure

A sample of the element was exposed through an imagebearing transparency and delaminated as described in part IV of Example 1 to give a tonable image on the tacky layer which could be toned with any desired color, e.g., white, except the C.I.S. Red 109 used in the photopolymerizable composition of part I, to give a two-color image suitable for use as a projection slide for visual aid purposes. There was also obtained a red reverse image on the cover sheet which can also be used for the same purpose. By repeating the process with the appropriate colored photopolymer layers, an overlay color proof could be obtained using the above elements. By toning the tacky layers from which the exposed photoadherent layer was removed with a white toner an overlay duplicate color proof was obtained. The peel force of a test sample is 580 g/inch when peeled at 20 inches/minute.

EXAMPLE 24

Overlay color proof elements were made in the following manner:

I. Nontonable Photoadherent Layer: Photopolymerizable Coating Composition

A coating composition was prepared as in Example 2 and was coated on polyethylene terephthalate film having a thickness of 0.0005 inch which had been surface treated by electrostatic discharge treated at 0.07 coulombs/ft$^2$. The coating weight was about 43–47 mg/dm$^2$.

II. Contiguous Layer: Tacky Elastomer Coating Composition

A 7.7% solution in methylene chloride was made using a stereospecific polybutadiene rubber containing 36% cis polymer and the balance is the trans polymer. The measured viscosity of the polymer solution is 3200 using a #4 spindle at 60 RPM (Brookfield Viscometer). The polymer has a narrow molecular weight distribution and is completely amorphous.

The resulting solution was coated on a 0.0025 inch thick polethylene terephthalate film in an amount of about 80 mg/dm$^2$ when dried.

III. Laminating Procedure

Samples of the photopolymerizable element were laminated in surface to surface contact with the tacky elastomer layers at a temperature of about 25° C. with a pressure of about 40 pounds per square inch.

IV. Preparation of Overlay Color Proofs

Elements resulting from step III were exposed through the appropriate halftone color separation negatives including a black printer negative. The elements were delaminated as described in Example 1 and toned and assembled as described therein to give a high quality overlay color proof. The peel forces of test samples are 80 g/inch, 102 g/inch, 145 g/inch when peeled at 600 inches/minute, 6000 inches/minute and 9000 inches/minute, respectively.

EXAMPLE 25

A high quality map was made by the surprint procedure in the following manner:

I. Nontonable Photoadherent Layer

A coating composition was prepared and coated as described in Example 24, part I.

II. Contiguous Layer

A coating composition was made as described in Example 20, part II and coated on the releasable layer coated polyethylene terephthalate film as described in Example 25, part II.

III. Laminating Procedure

Elements I and II were laminated as described in Example 24, part III. As many elements were made as determined by the number of colors required for the map.

IV. Operations for Constructing a Surprint Map

An element was stripped off the releasable coating from the surface of the contiguous layer and the element was laminated to the surface of a paper support as described in Example 2, part IV. The element was then exposed through a negative transparency of the road system of the map. The clear cover sheet was stripped off leaving a bared tacky tonable image of said road system which was toned magenta. A second element was stripped of its releasable layer and laminated to the paper element containing the toned red image of the road system. The resulting element was then exposed to a negative transparency color separation record of elevated geographical areas to be colored yellow. The above process was repeated and the yellow toner applied. Another element was applied and exposed to a negative transparency color separation record of the water areas, i.e., lakes, rivers and streams, etc. The bared tacky image of this record was toned with a blue color.

The process was repeated again using a negative transparency color separation record of railroads and power lines which was toned black. The process was repeated for lower elevation areas which were toned green. All negative separation records were of course exposed in precise registration. Over the resulting colored image layer combination there was laminated with pressure a clear layer of the element described under I above. The layer was photoexposed nonimagewise and served as a protective layer. This provided a high quality map showing the precise detail of the original. The peel forces of test samples are 550 g/inch and 450 g/inch when peeled at 60 inches/minute and 6000 inches/minute, respectively.

EXAMPLE 26

An element wherein the photopolymer layer contains a colorant.

I. Nontonable Photoadherent Layer

A polyethylene terephthalate photographic grade film, having a thickness of 0.001 inch but having no surface treatment, was coated with the following photopolymerizable composition:

| | |
|---|---|
| Polymethyl methacrylate (Inherent Viscosity: 0.26-0.22 for a solution of 0.25 in 50 mls. chloroform, at 20° C., using a No. 50 Cannon-Fenske Viscosimeter) | 17.75 g |
| Polymethyl methacrylate (Inherent Viscosity: 1.25-1.50 for a solution of 0.25 g in 50 mls. chloroform at 20° C., using a No. 50 Cannon-Fenske Viscosimeter) | 12.50 g |
| Polyoxyethylated trimethylol propane triacrylate (20 moles of ethylene oxide) (M.W. 1162) | 32.25 g |
| Phenanthrenequinone | 1.25 g |
| Carbon Black | 36.25 g |
| Trichloroethylene/methylene chloride (60/40) to make a 12% solids solution | |

The coating weight was 37.9 mg/dm$^2$ (dry).

II. Contiguous Tacky Layer

A coating solution was prepared using a stereospecific polybutadiene (98% cis, 2% trans) rubber. The solution was made up as a 9% concentration in methylene chloride. It was coated a 0.0025 inch thick polyethylene terephthalate film in an amount of about 80 mg/dm$^2$.

III. Lamination Procedure

Elements from I and II were laminated in surface to surface contact at room temperature and about 40 pounds per square inch pressure.

IV. Exposure and Delamination

The element was exposed to an image transparency by means of an exposing device identified as a nuArc ® Plate Maker "Flip Top" manufactured by the nuArc Company, Chicago, IL. There was evidence of image formation by means of photoadherence to the 0.001 inch polyethylene terephthalate film and the bottom layer can be toned with a white toner to give a positive-working system. The cover sheet contained a negative-working image.

EXAMPLE 27

Example 26 was repeated except that the cover sheet polyethylene terephthalate film was surface treated by exposure to electrostatic discharge (0.07 coulombs/ft$^2$), good adhesion was obtained and good images were formed on the treated cover sheet which could be used as a negative-working phototool, i.e., visual aid slides, exposure transparencies, and color proofing, etc. The peel force of a test sample is 140 g/inch when peeled at 9000 inches/minute.

The bared tacky layer could be toned with any desired color and/or white toner to provide the desired phototool or final product by a positive-working system.

EXAMPLE 28

A negative-working element was made in the following manner:

I. Nontonable Photoadherent Layer; Photohardenable Coating Composition

| | |
|---|---|
| Poly(acryloxybenzophenone/diacetone acrylamide/methyl methacrylate) (20/10/70) (MW 500,000) | 2.5 g |
| Tetraethylene glycol dimethacrylate | 1.25 g |
| (2-o-Chlorophenyl-4,5-diphenyl imidazolyl) dimer | 0.14 g |
| 2-Mercaptobenzothiazole | 0.10 g |
| Methylene chloride | 36.0 g |

The resulting composition was coated on the polyethylene terephthalate electrostatic discharge treated film described in Example 1 and dried to give a coating weight of 47 mg/dm$^2$.

II. Contiguous Layer: Tacky Elastomer Coating Composition

A coating solution as prepared in part II, Example 20 was coated on polyethylene terephthalate film having a releasable layer of polydimethyl siloxane coated thereon and dried to give a coating weight of 115 mg/dm$^2$.

III. Laminating Procedure

The surface of the contiguous layer was laminated at 82° C. to a paper support (identified as Kromkote ® marketed by the Champion Paper Corporation). The polyethylene terephthalate film with the release coating was stripped from the tonable tacky layer which was then laminated to the coated photohardenable layer element (I) in surface to surface relationship at room temperature with a pressure of 40 pounds per square inch.

IV. Exposure, Imaging and Toning Procedure

The element resulting from step III was exposed to a halftone negative, film record through the electrostatic discharge treated clear film cover sheet in contact with the nontonable, photohardenable layer for 30 seconds as on the exposing device of Example 2. As in Example 1, the cover sheet with the exposed photohardened image thereon was removed and the bared areas of the contiguous layer were toned with magenta toner to give a single color proof print. The peel force of a test sample is ~520 g/inch when peeled at 20 inches/minute.

EXAMPLE 29

A negative-working element was made in the following manner:

I. Nontonable Photoadherent Layer: Photohardenable Coating Composition

| | |
|---|---|
| Poly(methyl methacrylate/methacrylic acid) 90/10 (M.W. 30,000-50,000) | 59.6 g |
| Di-(3-methacryloxy-2-hydroxypropyl) ether of Bisphenol-A | 119.24 g |
| (2-o-Chlorophenyl-4,5-diphenyl imidazolyl) dimer | 6.6 g |
| Brightener I (described above) | 1.62 g |
| Brightener II (described above) | 7.8 g |
| 2,2'-Dihydroxy-4-methoxybenzophenone | 0.6 g |
| 2-Mercaptobenzothiazole | 3.0 g |
| Poly(ethylene oxide) (M.W. ca 1,000,000) | 1.52 g |
| Methylene chloride | 1600.0 g |

| | | |
|---|---|---|
| -continued | | |
| Methanol | 54.0 | g |

The resulting composition was coated on untreated polyethylene terephthalate and dried to give a coating weight of 32.8 mg/dm².

II. Contiguous Layer: Tacky Elastomer Coating Composition

A contiguous layer coated on polyethylene terephthalate having a releasable layer was prepared as in part II, Example 20, except that 480 g of cis-polybutadiene and 120 g of random copolymer of styrene/butadiene (40/60) are used.

III. Laminating Procedure

The coated photopolymerizable element (I) and the tonable tacky layer element (II) were laminated in surface to surface relationship at 105° C. with a pressure of 40 pounds per square inch.

IV. Operations for Constructing a Print

The laminated elements resulting from step III were handled as follows:

The polyethylene terephthalate cover sheet with the release coating was stripped from the tonable tacky layer of an element which was then laminated at 100° C. to a paper support (identified as Kromekote marketed by the Champion Paper Corporation). The element was then exposed to a halftone negative, minus green, color separation film record through the untreated clear film cover sheet in contact with the nontonable, photopolymerizable layer for 15 seconds on an exposing device identified as a nuArc ® Plate Maker "Flip Top" manufactured by the nuArc Company, Chicago, IL. The element was held for 1 minute, and the clear film cover sheet was stripped from the nontonable photopolymerizable layer at an angle of from 135°–180° at a rate of higher than 720 inches per minute. The exposed, positive image photoadhered to the untreated film thus exposing equivalent areas of the tacky elastomer contiguous layer. The bared areas of the contiguous layer were toned with a magenta (reddish) toner as described in Example 1 to give a high quality magenta proof. A high quality surprint color proof useful in the lithographic printing arts may be prepared using the elements resulting from step III using the procedures of step IV in Example 2.

EXAMPLE 30

Four negative-working laminated elements were made in the manner described in Example 29 except that in step I 62.46 g of di-(3-methacryloxy-2-hydroxypropyl)ether of Bisphenol A was used and instead of poly(methyl methacrylate/methacrylic acid), 116 g of one of the following binders was used for each element:
A. Cellulose acetate butyrate (6% acetate, 46% butyrate)
B. Poly(methyl methacrylate) (inherent viscosity ca 1.20)
C. Poly(styrene/acrylonitrile) (78/22)
D. Methacrylate/acrylonitrile/butadiene/styrene (46/9/31/14) resin.

In addition, each resulting solution was coated on a sample of polyethylene terephthalate having a thickness of 0.005 inch which had been surface treated by electrostatic discharge at 0.07 coulombs/ft² and dried to give a coating weight of about 30 mg/dm².

A high quality colored proof was prepared from each of the four laminated elements as described in step IV of Example 29 wherein the exposed positive image photoadhered to the electrostatic discharge treated film when it was removed from the element.

EXAMPLE 31

An element was made in the following manner:

I. Nontonable Photoadherent Layer: Photopolymerizable Coating Composition

| | |
|---|---|
| Partially esterified copolymer of styrene and maleic anhydride (1:1 ratio, M.S. 1700) (SMA resin by Arco) (25% esterified with isopropanol and methanol) | 4.50 g |
| Terpolymer of methyl methacrylate, ethyl acrylate and acrylic acid (37:56:7) (M.W. 260,000) | 214.0 g |
| Triethylene glycol methacrylate | 166.0 g |
| 2,2'-Dihydroxy-4-methoxybenzophenone | 50.0 g |
| Orasol blue 2GLN dye | 50.0 g |
| (2-o-Chlorophenyl-4,5-diphenyl imidazolyl) dimer | 50.0 g |
| 4,4-Bisdimethylaminobenzophenone | 5.0 g |
| Methylene chloride | 3710.0 g |
| Methanol | 415.0 g |

The resulting composition was coated on the 0.001 inch polyethylene terephthalate electrostatic discharge treated film of Example 1 to give a dry coating weight of 28 mg/dm².

II. Contiguous Layer

A contiguous layer element was prepared as described in Example 16.

III. Process

The photoadherent layer (I) and contiguous layer (II) were laminated as in Example 23, part III, and processed as in Example 23, part IV, to give an overlay proof. The peel force of a test sample is ~400 g/inch when peeled at 20 inches/minute.

EXAMPLE 32

An element was made in the following manner:

I. Nontonable Photoadherent Layer

Same as that of Example 2, part I.

II. Contiguous Layer

A coating solution was prepared from the following materials:

| | |
|---|---|
| Styrene/butadiene block copolymer (25/75) Typical Mooney Viscosity ML-4 at 100° C.: 47) | 300.0 g |
| C.I.S. Red 109 (1% solution in methanol) | 60.0 g |
| Methylene chloride | 1700.0 g |

The resulting solution was coated on 0.0025 inch polyethylene terephthalate support to give a dry coating weight of 90 mg/dm².

III. Process and Operation

The photoadherent layer (I) and contiguous layer (II) were laminated together as in Example 23, part III. After imagewise exposure, the exposed photopolymerizable material adhered to the 0.005 inch polyethylene terephthalate electrostatic discharge treated cover sheet when delaminated in the normal way. The bared areas of the tonable layer were toned with cyan toner to give a two-color image suitable for use as a projection slide for visual aid purpose. The peel force was the same as that of Example 2.

The foregoing examples represent preferred embodiments of the invention, wherein the exposed areas of the photoadherent layer adhere to and are removed by stripping the cover sheet, the areas of the photoadherent layer which remain on the contiguous layer being nonreceptive to toner particles due to their nontacky nature and the bared areas of the contiguous layer being receptive to toner particles due to its tacky nature. However, the difference in receptivity to toner may be effected by an intermediate treatment, e.g., exposure to actinic radiation, in other embodiments. As used herein, therefore, "tonable" means receptive or capable of being rendered receptive to toner and "nontonable" means nonreceptive or capable of being rendered nonreceptive to toner. The terms, of course, have reference to the same toner. In preferred embodiments, no intermediate treatment is required, the difference in tonability existing at least immediately after stripping the cover sheet.

As described above, the developed elements of the invention produce a novel imagebearing structure comprising a tacky layer bearing on its surface image areas of polymeric material and complementary toned image areas. It is particularly useful to produce a multilayer element comprising a plurality of imagebearing elements of the invention, which has an image that is a composite of the images of the individual elements. In such a multilayer element the individual elements are laminated successively or assembled in register with the tacky layer of an element adjacent to, and preferably in surface to surface contact with, the imagebearing surface of another element. A multicolor element can thereby be made if images of at least two of the elements which are of different colors, are laminated to produce a multicolor composite image.

In place of colored toners, it is possible to tone the exposed and delaminated layers of this invention with powders which are magnetic, catalytic for various chemical and electrochemical processes, etc. For example, by toning with metal powder, e.g., copper, one obtains an image which can be electrolessly plated to form a circuit element, and by repeated lamination, imaging, stripping, toning with copper powder, and electrolessly plating, one can prepare a multilayer circuit board.

The surface of the color prints shown in the above examples can be delustered by laminating the tacky layer of a fresh element to the print, exposing the entire surface nonimagewise through a tint to actinic radiation, stripping off the photoadherent layer and dusting the tonable layer with a particulate material, e.g., talc, etc. Alternatively, the surface of the color prints shown in the above examples may be protected by laminating the tacky, tonable layer of a fresh element to the print, and exposing the entire surface nonimagewise without removing the cover sheet.

The tacky contiguous layer may contain a colorant or pigment and in some applications the layer may have an optical density of at least 3 and preferably 4 to transmitted actinic or visible light. Thus, a toned image on an opaque background can be provided as a single color print or as the base of a multicolor proof. Alternatively, the colorant or pigment may be contained in the sheet support (4) or the sheet support may be an opaque material such as metal foil, e.g., a copper clad surface. In either instance the sheet support for such applications should have an optical density of at least 3 and preferably 4 to at least a portion of the actinic and visible light spectrum. However, for other applications, such as the use of a toned element as a transparency, the sheet support (4) may have an optical density to visible and actinic light substantially below 3.

The elements are versatile and can be used to form a negative-working overlay, i.e., two or more cover sheets with exposed areas of the photoadherent layer thereon in register with each other. In this embodiment each peel apart element is exposed through a different color separation negative and the respective photoadherent layers are colored in a spectral region corresponding to the color separation negative used for the exposure. Preferably the elements and colored separation negatives correspond, respectively, to black, yellow, magenta and cyan.

We claim:

1. A peel apart photosensitive element comprising in order from top to bottom, (1) a strippable cover sheet comprised of a polymeric film which is transparent to actinic radiation, (2) a photoadherent layer comprising a photohardenable material with ethylenically unsaturated or benzophenone type groups, and (3) a tacky, nonphotosensitive organic contiguous layer which is tonable by embedding of particulate material, and (4) a sheet support, the exposed areas (5) of said photoadherent layer, after imagewise exposure of said element to actinic radiation, having greater adhesion to said cover sheet than to said contiguous layer, and are removable with said cover sheet. and the unexposed areas (6) of said photoadherent layer having greater adhesion to said contiguous layer than to said cover sheet and are not removable with said cover sheet, said photoadherent layer being nontonable under a condition under which the contiguous layer is tonable.

2. An element according to claim 1 wherein said contiguous layer (3) is colorless.

3. An element according to claim 1 wherein said photoadherent layer (2) is comprised of an ethylenically unsaturated photohardenable material selected from photopolymerizable, photocrosslinkable, photodimerizable compositions and combinations thereof.

4. An element according to claim 1 wherein said contiguous layer (3) is comprised of a elastomeric material.

5. An element according to claim 4 wherein said elastomeric material is selected from butadiene and isoprene polymers.

6. An element according to claim 1 wherein said strippable cover sheet (1) is a polymeric film which is surface treated by electrostatic discharge or flame treatment.

7. An element according to claim 1 wherein said photoadherent layer (2) is a colorless layer.

8. An element according to claim 1 wherein the sheet support (4) is contiguous to said tacky layer (3) and is taken from the group consisting of a film support and a film support bearing an auxiliary layer.

9. An element according to claim 3 wherein said photohardenable layer (2) is a nontacky photopolymerizable layer comprised of a macromolecular organic polymeric binder, an organic compound having at least one terminal ethylenic group capable of free radical initiated, chain propagated addition polymerization, and a free radical generating addition polymerization photoinitiating system activatable by actinic radiation.

10. An element according to claim 1 wherein said cover sheet (1) is a polyethylene terephthalate film.

11. An element according to claim 1 wherein the contiguous layer (3) contains an added colorant.

12. An element according to claim 11 wherein the colored contiguous layer has an optical density of at least 3 over a portion of the visible or actinic spectrum.

13. An element according to claim 1 wherein the photoadherent layer (2) contains an added colorant.

14. An element according to claim 1 wherein the sheet support (4) is transparent to actinic radiation.

15. An element according to claim 1 wherein the sheet support (4) contains an added colorant.

16. An element according to claim 15 wherein the colored sheet support has an optical density of at least 3 over a portion of the visible or actinic spectrum.

17. An element according to claim 8 wherein the auxiliary layer is interposed between the contiguous layer (3) and the sheet support (4).

18. An element according to claim 17 wherein the auxiliary layer is a release layer.

19. An element according to claim 17 wherein the auxiliary layer is an anchoring layer.

20. An element according to claim 17 wherein the auxiliary layer is thermoplastic.

21. An element according to claim 11 wherein the sheet support (4) has a metal surface in contact with the contiguous layer (3).

22. An element according to claim 21 wherein the metal surface is copper.

23. An element according to claim 1, after imagewise exposure, stripping of the cover sheet (1) and toning, comprises a contiguous layer (3) bearing on its surface, image areas (6) of polymeric material and complementary toned image areas (7).

24. A multilayer element comprising a plurality of elements of claim 23 wherein the contiguous layer (3) of an element is adjacent to the imagebearing surface of another element.

25. A multicolor element comprising a multilayer element of claim 24 wherein images of at least two of the elements are of different colors.

26. An electrically conductive element comprising an element of claim 23 wherein the complementary toned image areas (7) comprise areas that have been toned with metal powder and plated.

27. An element according to claim 26 wherein the complementary toned image areas comprise areas (7) that have been toned with copper powder and electrolessly plated.

28. A multilayer electrically conductive element comprising a plurality of elements of claim 26 wherein the contiguous layer (3) of an element is in surface to surface contact with the imagebearing surface of another element.

29. An element according to claim 1 wherein, after imagewise exposure and stripping the cover sheet (1), the bared areas (7) of said contiguous layer (3) are receptive to particulate toner, and the unexposed areas (6) of said photoadherent layer (2) remaining on the contiguous layer (3) are nonreceptive to particulate toner.

30. An element according to claim 9 wherein, after imagewise exposure and stripping the cover sheet (1), the bared areas (7) of said contiguous layer (3) are receptive to particulate toner, and the unexposed areas (6) of said photoadherent layer (2) remaining on the contiguous layer (3) are nonreceptive to particulate toner.

31. An element according to claim 1 wherein the nontonable photoadherent layer is, or can be rendered, substantially more resistant to embedding by particulate material than the tacky contiguous layer into which particulate material can be embedded.

32. An element according to claim 1 wherein the peel force required to remove the cover sheet (1) with exposed areas (5) thereon from the contiguous layer (3) of the element is at least four times the peel force required to remove the cover sheet (1) from the unexposed areas (6) of the photoadherent layer (2) of the element.

* * * * *

UNITED STATES PATENT OFFICE
CERTIFICATE OF CORRECTION

PATENT NO. : 4,247,619
DATED : January 27, 1981
INVENTOR(S) : Abraham B. Cohen and Roxy Ni Fan It is certified that error appears in the above-identified patent and that said Letters Patent are hereby corrected as shown below:

| Column | Line | |
|--------|------|---|
| 3 | 58 | "about" should be --above--. |
| 6 | 43 | "porportions" should be --proportions--. |
| 29 | 39 | "11" should be --1--. |

Signed and Sealed this

Sixteenth Day of March 1982

[SEAL]

Attest:

GERALD J. MOSSINGHOFF

Attesting Officer — Commissioner of Patents and Trademarks